United States Patent
Chang et al.

[11] Patent Number: 5,879,954
[45] Date of Patent: Mar. 9, 1999

[54] RADIATION-HARD ISOPLANAR CRYO-CMOS PROCESS SUITABLE FOR SUBMICRON DEVICES

[75] Inventors: Chen-Chi P. Chang, Newport Beach; James S. Cable, San Clemente, both of Calif.

[73] Assignee: Raytheon Company, Lexington, Mass.

[21] Appl. No.: 655,303

[22] Filed: May 20, 1996

[51] Int. Cl.⁶ .................................................. H01L 27/00
[52] U.S. Cl. .................. 437/57; 437/44; 437/45; 437/53; 437/58
[58] Field of Search ................. 437/44, 45, 53, 437/56, 57, 58

[56] References Cited

U.S. PATENT DOCUMENTS

| | | | |
|---|---|---|---|
| 4,599,789 | 7/1986 | Gasner | 437/57 |
| 4,902,639 | 2/1990 | Ford | 437/58 |
| 5,028,556 | 7/1991 | Chang | 437/57 |
| 5,342,802 | 8/1994 | Kubokoya et al. | 437/57 |
| 5,355,011 | 10/1994 | Takata | 257/408 |
| 5,464,784 | 11/1995 | Crisenza et al. | 437/44 |
| 5,489,545 | 2/1996 | Taguchi | 437/53 |
| 5,506,161 | 4/1996 | Orlowski et al. | 437/57 |
| 5,521,106 | 5/1996 | Okabe | 437/57 |

FOREIGN PATENT DOCUMENTS

| | | | |
|---|---|---|---|
| 2197127 | 5/1988 | Japan | 437/56 |
| 0104215 | 5/1991 | Japan | 437/58 |

OTHER PUBLICATIONS

Stanly Wolf, "Silicon Processing for The VLSI Era", vol. 3, 1995.

*Primary Examiner*—John Niebling
*Assistant Examiner*—Long Pham
*Attorney, Agent, or Firm*—Leonard A. Alkov; William C. Schubert; Glenn H. Lenzen, Jr.

[57] ABSTRACT

A radiation-hard isoplanar cryo-CMOS process suitable for submicron device fabrication reduces channel length to submicron levels. A channel stop (52) is formed after a first polysilicon gate (50) is formed to reduce the space between a n-/n+ source/drain region (67, 68) and the channel-stop region (52). Double gate oxidation steps are performed to increase polyoxide thickness. A thermal oxide masking step is carried out to obtain a thin layer of gate oxide under a second polysilicon gate (60A) for CMOS devices. The process includes two different second polysilicon masking steps to provide dimension control of second polysilicon gates (60A) and to remove bridging of the second polysilicon where the second polysilicon layer (58) is over the first polysilicon layer (48).

9 Claims, 4 Drawing Sheets

RADIATION-HARD ISOPLANAR CRYO-CMOS PROCESS SUITABLE FOR SUB-MICRON DEVICES

BACKGROUND OF THE INVENTION

1. Field of the Invention

The present invention relates to semiconductor devices and, more particularly, complementary metal-oxide semiconductor (CMOS) devices which operate at cryogenic temperatures and which are radiation hard.

2. Description of Related Art

Complementary metal-oxide semiconductor (CMOS) technology is so named because it uses both p- and n-type (i.e., complementary) metal-oxide semiconductor (MOS) transistors in its circuits. CMOS has its origins in 1963, and the first CMOS integrated circuits (ICs) were fabricated in 1966. The earliest commercial application in volume was in digital watches in which power consumption is a primary concern. Later, CMOS was widely used in circuits for calculators in which low-power dissipation is important, and in circuits where very high noise margins are important, e.g., radiation-hard circuits.

With the dawning of the very large-scale integration (VLSI) era, power consumption in conventional n-type metal-oxide semiconductor (NMOS) circuits began to exceed tolerable limits. A lower power technology was needed to exploit the VLSI fabrication techniques. CMOS represented such a technology.

From 1968 to 1987, a 200-fold increase in functional density and a 20-fold increase in speed of integrated circuits took place. One example of this tremendous increase in density is the Intel 4004 4-bit microprocessor which in 1971 had 2,300 devices. By 1995, the well-known Intel 80386 16-bit processor had 275,000 devices.

Although CMOS has many advantages, CMOS is susceptible to short-channel and hot-carrier effects when device channel lengths drop below about 2 $\mu$m. In addition, hot-electron effects in n-channel devices typically become more severe as channel lengths narrow. In addition, well contacts must be provided in CMOS circuits, which take up more chip area than in other IC technologies.

One application for CMOS devices is in focal plane array (FPA) technology. Focal plane arrays are used in night-vision devices which thermally image scenes using infrared radiation. The focal plane arrays are cooled to cryogenic temperatures in order to reduced unwanted thermal noise. Hence, the category of CMOS devices used at cryogenic temperatures is known as cryo-CMOS.

Current FPA processes require channel stops around each n-channel device for low-temperature radiation-hardening purposes. This process is not self-aligned and requires a large space between the channel stop and n+ implantation region. The active-area region is defined by a wet chemical oxide etch process and not by a local oxidation process (LOCOS) currently widely used in the IC industry.

Many applications in focal plane array technologies require radiation-hard, high-density, large-array read-outs. To do this, high-density, low-noise, and radiation-hard cryo-CMOS processes are required. Current FPA processes yield channel lengths in the neighborhood of 4 micrometers ($\mu$m). Reducing the channel length further presents many difficulties.

Conventional fabrication processes may yield a minimum channel length of 2.5 $\mu$m, which is usually the smallest achievable for these processes. Many new applications require device channel length to be in the submicron range (i.e., less than 1 $\mu$m) to increase device speed, packing density, and read-out resolution while maintaining the same low-temperature radiation hardness and device performance.

Accordingly, it is an object of the present invention to provide a process which produces a radiation-hard cryo-CMOS device with channel lengths in the submicron region without experiencing any degradation in device radiation hardness or in device performance.

SUMMARY OF THE INVENTION

According to one aspect of the present invention, a process for fabricating radiation-hard CMOS devices and charge-coupled devices (CCDs) for use at cryogenic temperatures includes forming an n-well in a substrate and forming a p-well in the substrate next to the n-well. The substrate may be either type of semiconductor material but is preferably n-type material in an exemplary embodiment of the invention.

A first gate oxide is thermally grown in an active-area region on top of the n- region, the n-well region, and the p-well region. A first polysilicon layer is then deposited and patterned. A p+ channel stop is formed after a first polysilicon gate is defined to reduce the temperature cycles associated with process according to the present invention. Thus, the space between an n+/n- source/drain region and the p+ channel stop region can be significantly reduced to increase the circuit packing density. The p+ channel stop is heavily doped to a level at which an n-channel field threshold voltage is significantly increased, preferably over 50 volts. Therefore, even after a high dose of radiation, a field n-channel threshold voltage will be maintained at a desired level to prevent the turn-on of the field devices.

According to another aspect of the present invention, a first polysilicon gate is defined for a first CCD gate and a capacitor bottom plate.

Another aspect of the present invention is that a thicker gate oxide layer is grown under a second polysilicon gate for CCDs and on top of the first polysilicon-oxide layer to increase the dielectric breakdown strength between the first polysilicon layer and the second polysilicon layer. A thin gate oxide layer is grown under the second polysilicon layer for submicron CMOS devices. The gate oxide layers are grown by two gate oxidations and thermal oxide (TO) masking and oxide etching processes. With the first oxidation, the gate oxide layer is grown in the CCD region for the second polysilicon gate, and the polyoxide layer is grown on top of the first polysilicon layer to a desired thickness.

After the first oxidation, an additional thermal oxide masking step is performed, and oxide etching steps are performed to remove the gate oxide completely in the active-area regions for the CMOS devices. With the second oxidation, a final gate oxide is grown to a desired thickness, a thickness suitable for submicron CMOS devices. As the thickness of the gate oxide under the second polysilicon gate in CCD regions and the thickness of the polyoxide layer between the first polysilicon layer and the second polysilicon layer result from the combination of these two oxidation steps, and are not influenced by the thickness of the final gate oxide layer, the thickness of the gate oxide layer can be made compatibly with any submicron CMOS process while still maintaining good dielectric oxide breakdown strength between the first polysilicon layer and the second polysilicon layer and in the second polysilicon gate in the CCD regions by adjusting the thickness of the first gate oxide layer to have the same total oxidation thickness after both oxidation steps.

Yet another aspect of the present invention is that two masking and polysilicon etching steps for the second polysilicon (PS2) layer are carried out. The first second polysilicon (PS2) masking and etching processes define the polysilicon gates for the CMOS devices. The CCD regions and the second polysilicon capacitor areas are protected by oversized photoresist patterns during the first PS2 masking/ etching process. An additional second polysilicon (PS2) masking and etching process defines the second polysilicon gates in the CCD regions and the second polysilicon gates for the top capacitor plate in the active-area regions. With the first PS2 masking/etching process, the polysilicon gates can be easily defined anisotropically to a small gate length without any over-etching process due to smooth etching steps. The second polysilicon gates in the CCD regions and the capacitive areas can be defined by over-etching to remove polysilicon sleeves associated with the straight angles across the first polysilicon layer underneath the second polysilicon layer.

One of the advantages of the radiation-hard CMOS process of the present invention is that the channel length of the device can be significantly reduced to about 0.25 $\mu$m without any degradation in gate capacitance, CCD performance, and device radiation hardness. Further, with a significantly reduced channel length, device speed is increased, packing density is improved, and read-out resolution is improved while maintaining low-temperature radiation hardness and CCD performance.

Other aspects, features, and advantages of the present invention will become apparent to those skilled in the art from a reading of the following detailed description with reference to the accompanying drawings.

DETAILED DESCRIPTION OF THE PREFERRED EMBODIMENTS

Figure 1:
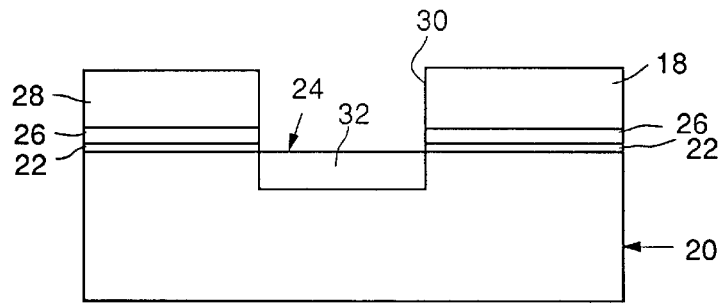
FIG. 1 is a cross-sectional view of a CMOS device illustrating fabrication principles of an initial step in a CMOS process according to the present invention.

Rather than provide an exhaustive description of all possible preferred embodiments of the present invention, a detailed description of one of the preferred embodiments which exemplifies the principles of the present invention will be provided. However, those skilled in the art will realize other alternative embodiments in accordance with the principles of the present invention. Accordingly, it is intended that these alternative embodiments are also within the scope of the principles of the present invention.

In CMOS technologies, both n-channel and p-channel transistors must be fabricated on the same wafer. Only one type of device can be fabricated on a given starting substrate. To accommodate the device type that cannot be built on this substrate, regions of a doping type opposite to that present in the starting material must be formed. These regions of opposite doping, called "wells" (or "tubs") are the first features to be defined on a starting wafer. This is done by implanting and diffusing an appropriate dopant to attain the proper well depth and doping profile. The doping type of the well becomes the identifying characteristic of the CMOS device. A p-type substrate is connected to the most negative circuit voltage, and an n-type substrate to the most positive to ensure that p-n junctions are not forward biased during circuit operation.

The p-well process involves the creation of p-regions in an n-type substrate. The p-wells are formed by implanting a p-type dopant into an n-substrate, at a high enough concentration to over-compensate for the substrate doping and to give adequate control over the p-type doping in the well. The starting n-type substrate, however, must also have sufficient doping to ensure that the characteristics of devices fabricated in the substrate regions are adequate. The p-well doping must therefore be about five times to ten times higher than the doping in the n-substrate.

In the n-well process, the p-channel devices are formed in the more heavily doped n-well. The wells cannot be made too deep, since the lateral diffusion would then take up too much area. On the other hand, if the wells are too shallow, vertical punchthrough will occur. Also, appreciable leakage current can flow in the vertical path in different situations. For example, punchthrough can occur if the depletion regions of the p+/n−well junction and the n−well/p+− substrate junction touch each other.

In a two-well approach, two separate wells are formed for n-channel and p-channel transistors in a lightly doped substrate. The substrate may be either a lightly doped wafer of n or p material, or a thin, lightly doped epitaxial layer on a heavily doped substrate. Each of the well dopants is implanted separately into the lightly doped surface region and is then driven in to the desired depth.

The doping profiles of each of the device types can be set independently, since the constraint of single-well CMOS does not exist. At submicron dimensions, the body doping of both transistor types must be raised significantly to prevent punchthrough and to maintain adequate threshold-voltage levels. Self-aligned channel stops can be implemented in the two-well approach, allowing the spacing between n-channel and p-channel devices to be reduced.

If a smaller spacing between the n-channel and p-channel devices is to be possible, the channel-stop doping concentration must somehow be increased, particularly in the substrate regions in n-well CMOS. During field oxidation, boron segregates into the oxide, while phosphorus piles up at the silicon surface. As a result, in an n-well process a separate p-type channel-stop implant must be added to increase the surface concentration of the lightly doped p-substrate. Without such an implant, inversion between the n-channel devices is likely to occur.

With reference to the drawings, particularly to FIG. 1, the starting material in a CMOS process of the present invention is a doped substrate 20 on which a first oxide layer 22 is formed. Although the substrate 20 may be p-type material, it is preferable for the substrate 20 to be n-type material.

An n-well 24 is formed in the substrate 20, which can be carried out in any number of ways. For example, a first nitride or nitride/oxide layer 26 is deposited on the substrate 20. Photoresist 28 is used to mask a pattern of windows 30 through the layers of nitride/oxide 26 and oxide 22, which layers are removed by photoengraving or etching. A dopant such as phosphorus 32 may then be implanted through the window 30 to form the n-well 24. The phosphorus dopant 32 may implant slightly horizontally as well as vertically.

Figure 2:
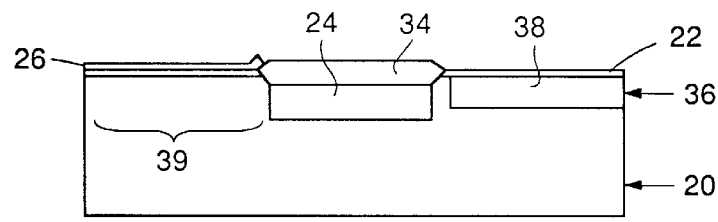
FIG. 2 is a cross-sectional view of a CMOS device illustrating fabrication principles, including a well-forming step, in a CMOS process of the invention.

With reference to FIGS. 1 and 2, a second oxide layer 34 is grown on the n-well 24. The first nitride/oxide layer 26 is then removed over the area of the substrate 20 in which a p-well 36 is to be formed. The second oxide layer 34 over the n-well 24 is grown to a thickness that is sufficient to block the implant, such as boron 38, used to form the p-well 36. During the p-well implant, the boron 38 penetrates the silicon substrate 20 only in the desired well area.

A preferred application of the CMOS device of the present invention is in a focal plane array. Accordingly, a charge-coupled device (CCD) region 39 may be defined in the lightly doped n-type substrate 20. Circuitry for a CCD, including CCD gates, is located in the CCD region 39 of the device.

Figure 3:
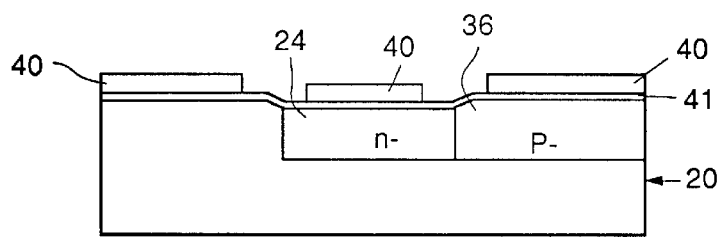
FIG. 3 is a cross-sectional view of a CMOS device illustrating fabrication principles, including an active-area masking step, in a CMOS process according to the invention.

With reference to FIGS. 2 and 3, the wells 24 and 36 are driven in or diffused at a predetermined temperature for a predetermined amount of time. Since the implantation process is unable to place the phosphorus and boron ions 32 and 38 deeply enough into the silicon substrate 20, these impurities must be driven in or diffused to the appropriate depth during this subsequent high-temperature cycle. At the conclusion of the drive-in steps, regarding the doping concentration in the wells 24 and 36, the n-well 24 may have a higher doping concentration to improve the punchthrough performance of the devices and to eliminate the need for a separate channel-stop step for the n-well 24, which will be discussed in more detail below. As shown in FIG. 3, the p-well 36 and the n-well 24 may contact each other after diffusion into the substrate 20.

A higher concentration in both wells 24 and 36 produces submicron devices with relatively high punchthrough voltage between source and drain regions. At this time, the second oxide layer 34, the first nitride layer 26, and the first oxide layer 22 (as shown in FIG. 2) are stripped in order for a second nitride layer 40 and a third oxide layer 41 to be formed and for an active-area mask to be applied.

Figure 4:
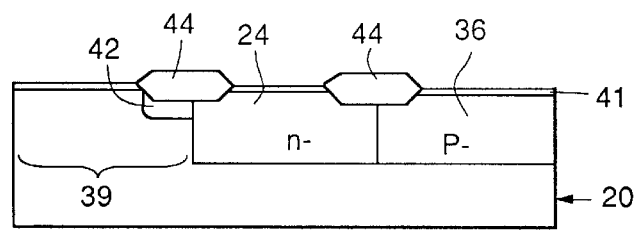
FIG. 4 is a cross-sectional view of a CMOS device illustrating fabrication principles of a CMOS process of the present invention, including p-channel stop masking/ implantation steps to increase p-channel field threshold voltage in a CCD region.

With reference to FIGS. 3 and 4, an n-type field mask is carried out. As the substrate material of the CCD region 39 is lightly doped, the field threshold of the CCD region 39 is low and needs to be raised. Accordingly, n-type material is implanted or doped in the CCD region 39 to raise the field threshold thereof. Further, an n-channel stop 42 is formed in the substrate 20 by implanting n+ material in the CCD region 39 at an area adjacent to the active-area region. The n-channel stop 42 is formed by applying photoresist over the n-well 24 and the p-well 36, implanting n-type material, and then stripping the photoresist.

Thereafter, field oxide 44 is thermally grown on the device at openings formed in the second nitride layer 40. After the field oxide 44 is grown, the second nitride layer 40 is stripped from the active-area regions and the CCD regions 39, yielding the device shown in FIG. 4.

Figure 5:
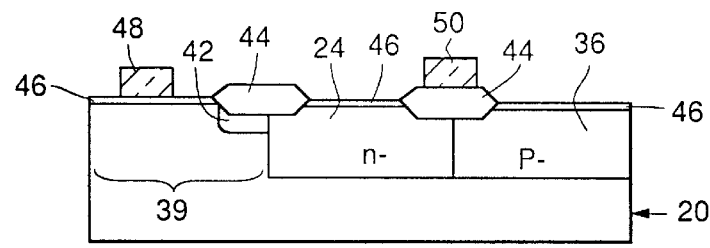
FIG. 5 is a cross-sectional view of a CMOS device illustrating fabrication principles of a CMOS process according to the present invention, including a first thermally grown gate oxide layer step, a first polysilicon layer deposition step, and a first polysilicon masking/etching steps.

With reference to FIGS. 4 and 5, the third oxide layer 41 is stripped, and a first gate oxide layer 46 is formed on the device. The next steps in the inventive process are first polysilicon (PS1) deposition, masking, and plasma polysilicon etching steps for the CCD gates in the CCD region 39 and for a bottom polysilicon plate of a gate capacitor. These first PS1 steps result in CCD PS1 48 over the CCD gates and capacitor PS1 50 on the field oxide 44 to serve as the bottom plate of the gate capacitor, which will be discussed in more detail below.

After a relatively low dose of radiation, the n-channel field threshold voltage will drop below normal operating voltage ($V_{DD}$) of the device. As such, the device is unable to switch because the device is always on. However, with the formation of a heavily doped channel stop, the field threshold voltage may be raised over the normal operating voltage, even after a very high dose of radiation, so that the device is able to switch and function properly.

Figure 6:
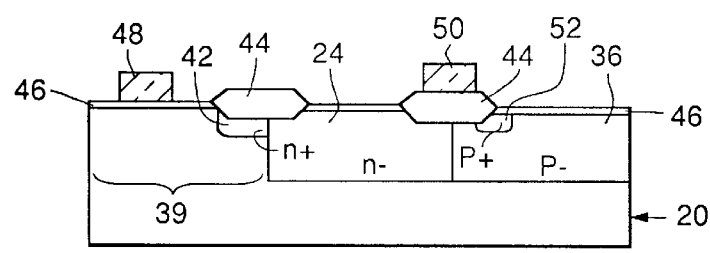
FIG. 6 is a cross-sectional view of a CMOS device illustrating fabrication principles of a CMOS process of the invention, including p+ channel stop masking/implantation steps to increase n-channel field threshold voltage in an active-area region.

Accordingly, with reference FIG. 6, the process continues by forming a channel-stop implant 52 near the p-well field region 36 to form a p+ channel-stop doping layer. In the exemplary embodiment, the p+ channel stop 52 is preferably a boron implant. The boron implant heavily dopes p+ in the p+ channel stop 52 and increases the n-channel field threshold voltage, thereby improving the device radiation hardness at low temperatures. For example, the n-channel field threshold voltage may be increased by 20 times the normal threshold voltages; in some applications, this may be about 100 volts. Therefore, after being subject to radiation and the subsequent formation of electron-hole pairs, the n-channel field threshold voltage will still maintain a value higher than the normal operating voltage after a high dose of radiation.

Figure 10:
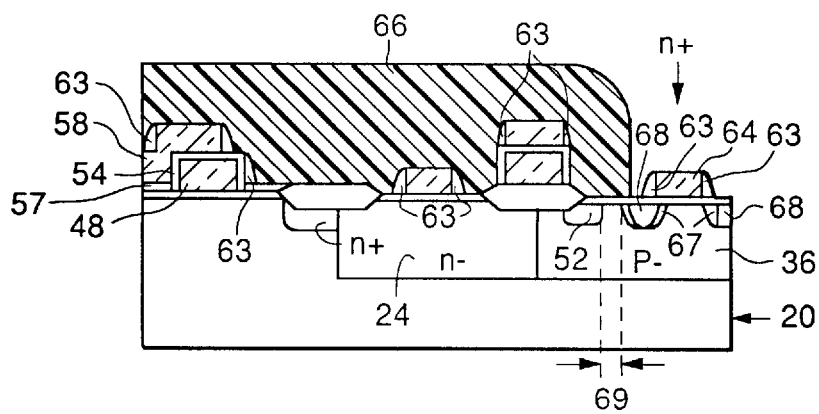
FIG. 10 is a cross-sectional view of a CMOS device illustrating fabrication principles of a CMOS process of the present invention, including n− lightly-doped drain (LDD) masking/implantation steps, a spacer oxide deposition step, and formation and n+ masking/implantation steps.

Advantageously, the p+ channel stop 52 is formed after the steps for forming (1) the field oxide 44, (2) the first high-temperature gate oxide 46, and (3) the first polysilicon layer 48 and 50. It has been determined that by forming the p+ channel stop 52 at this stage in the process that the distance between the p+ channel stop 52 and the n−/n+ source/drain region 67/68 (as shown in FIG. 10) can be significantly reduced to improve the device packing density. This is a significant improvement over prior radiation-hard cryo-CMOS devices. If the p+ channel stop 52 were formed prior to forming the first gate oxide layer 46, for example, then the high temperatures used to form the first gate oxide layer 46 would cause diffusion of the p+ channel stop 52, which would be detrimental to establishing a minimal space between the p+ channel stop 52 and the n+/n− source/drain regions.

Figure 7:
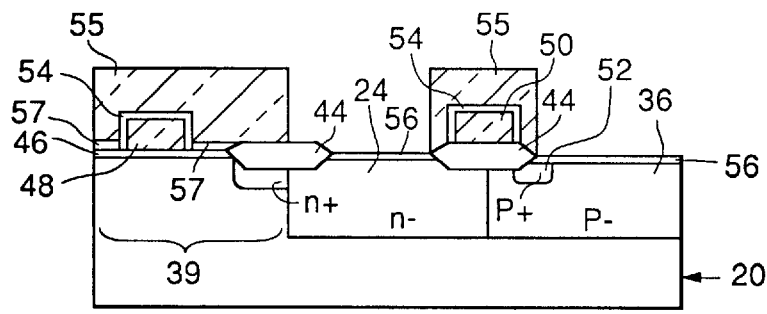
FIG. 7 is a cross-sectional view of a CMOS device illustrating fabrication principles according to the present invention, including (1) a first gate oxide step, (2) thermal oxide masking/etching steps to completely remove oxide in the active area regions of the CMOS device, and (3) a final gate oxide step for the CMOS devices.

With reference to FIGS. 6 and 7, the fabrication process next first oxidizes the first polysilicon layer, PS1 48 and 50, to form a polyoxide layer, indicated by reference numeral 54. The cryo-CMOS structure is then subjected to a thermal oxide (TO) mask to protect the polyoxide layer 54 in the CCD regions 39 and the capacitor areas with photoresist 55. The thermal oxide masking/oxide etching step is carried out to completely remove the first gate oxide layer 46 in the active area region outside of the CCD regions 39. A final gate oxide layer 56 is then grown for high-speed CMOS devices. The thickness of the final gate oxide layer 56 depends on the individual process for different channel length applications. The final thickness of the polyoxide layer 54 depends on both oxidation steps, including the oxidation step for forming the polyoxide layer 54 and the thermal oxidation step, but does not depend on the step for forming the final gate oxide layer 56. A minimal thickness of the polyoxide layer 54 must be achieved to obtain a reasonable dielectric breakdown strength between the first polysilicon layer 50 and the second polysilicon layer (see reference numeral 60A in FIG. 8) for reliable devices. A CCD gate oxide layer 57 is also formed on the first gate oxide layer 46 in the CCD region 39.

For foreseeable shorter channel lengths, a thinner gate oxide layer 56 is needed. With conventional thin oxide processes, a reasonable polyoxide dielectric breakdown strength cannot be achieved. However, with the double oxidation process plus the additional thermal oxide masking/ oxide etching process of the present invention, a good polyoxide dielectric breakdown strength for a thin final gate oxide layer 56 is achieved by adding the thickness of the first oxidation step.

Figure 8:
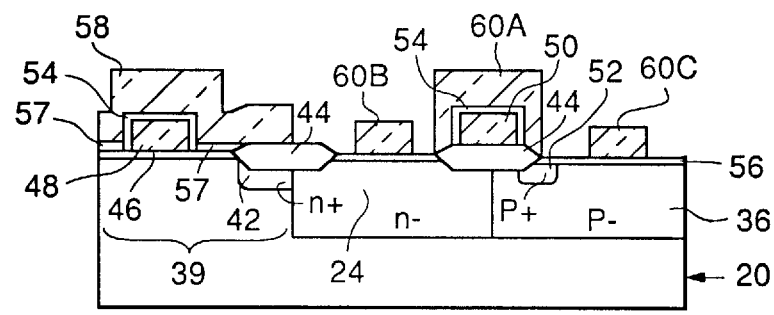
FIG. 8 is a cross-sectional view of a CMOS device illustrating fabrication principles of a process according to the invention, including a second polysilicon layer deposition step, a polysilicon masking step, and an anisotropical plasma etching step to define polysilicon gates for the CMOS devices and polysilicon gates in the CCD region with capacitor regions covered by an oversized photoresist layer.

A second polysilicon (PS2) layer is then deposited with subsequent masking/polysilicon etching steps being carried out. The second polysilicon deposition forms a second polysilicon layer for the CCD gates of the CCD region 39, as shown by reference numeral 58 (CCD PS2), and forms a second polysilicon layer 60A for the top plate of the gate capacitor (capacitor PS2), a second polysilicon layer 60B for the p-channel devices (p-channel PS2), and a second polysilicon layer 60C for the n-channel devices (n-channel PS2). An anisotropic plasma etching process defines the various PS2 layers 60A, 60B, and 60C to control the gate length as seen in FIG. 8. The second polysilicon layer 58 in the CCD region 39 and the top capacitor plate 60A are protected by an oversized photoresist layer during the etching. As the surface is smooth, substantial over-etching does not need to take place to remove any polysilicon sleeves. The process of the present invention is compatible with plasma polysilicon etching processes used in the IC industry for devices having submicron channel lengths.

Figure 9:
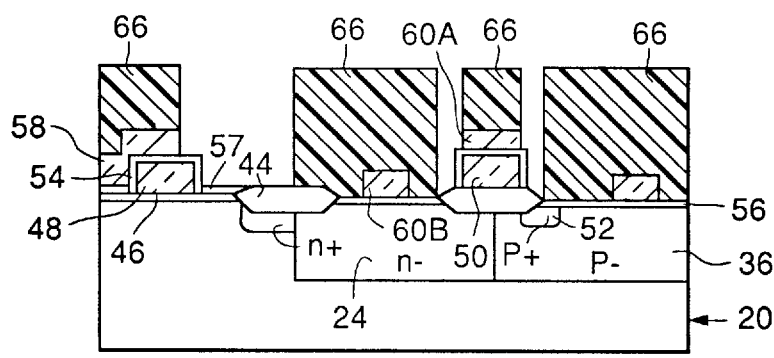
FIG. 9 is a cross-sectional view of a CMOS device illustrating fabrication principles according to the present invention, including additional polysilicon masking and etching steps with substantial over-etching to remove polysilicon sleeves associated with sharp steps caused by the first polysilicon layer.

FIG. 9 illustrates a CMOS device resulting from the next steps in the fabrication process in which the cryo-CMOS device is masked with additional polysilicon masking and etching steps. The regular CMOS second polysilicon gates are protected by the photoresist 66 during the etching. Those areas at which the CCD PS2 layer 58 is on top of the CCD PS1 layer 48 and the polysilicon capacitor top plate 60A are over-etched by an isotropic plasma etching process to remove polysilicon sleeves caused by the sharp first polysilicon layers 48 and 50. With the double second polysilicon masking/etching steps, the channel length for the CMOS devices can be easily controlled without over-etching by the first polysilicon mask, and the polysilicon sleeves can be completely removed with the isotropic plasma etching by the second polysilicon mask.

With reference to FIG. 10, a self-aligned n− mask and n− implantation is carried out for n− source regions 67. Oxide or nitride spacers 63 are then formed to reduce the n-channel hole-electron effects for short-channel devices. A self-aligned n+ mask and n+ implantation is then performed to form the n+ drain regions 68. The space between the p+ channel stop 52 and the first n− source region 67 is shown by reference numeral 69. This space 69 is preferably larger than or equal to about 1 μm to increase n+ to p+ channel stop diode breakdown voltage and to reduce leakage to normal operating conditions.

Figure 11:
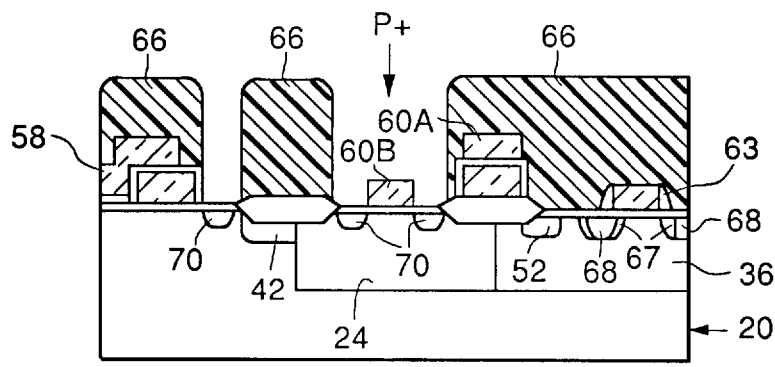
FIG. 11 is a cross-sectional view of a CMOS device illustrating fabrication principles, including p+masking/ implantation steps, in a CMOS process according to the present invention.
Figure 12:
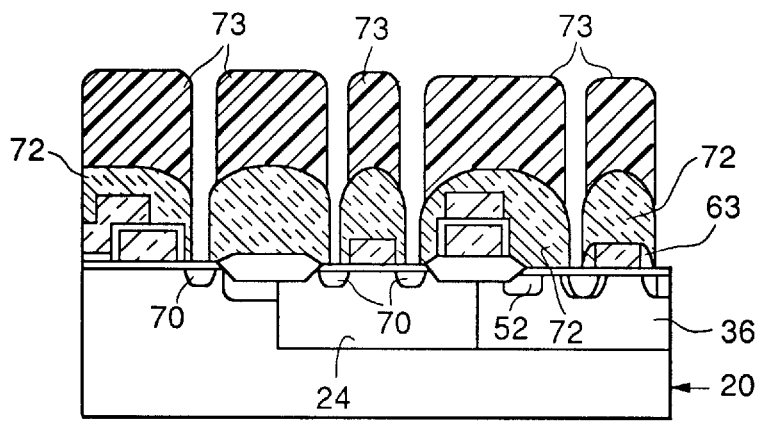
FIG. 12 is a cross-sectional view of a CMOS device illustrating fabrication principles, including a further deposition step and contact masking/etching steps, in a CMOS process of the invention.
Figure 13:
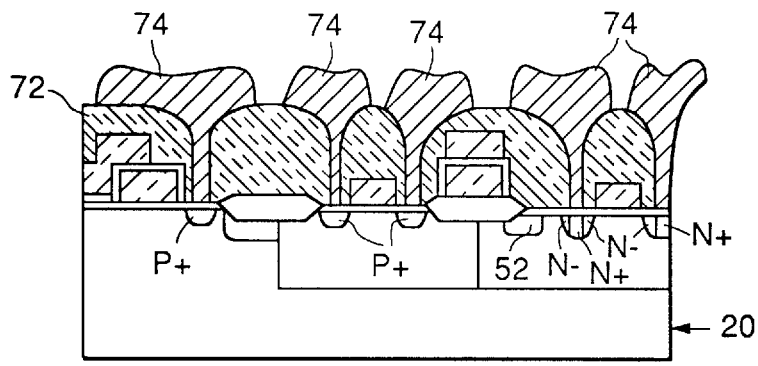
FIG. 13 is a cross-sectional view of a CMOS device illustrating fabrication principles, including a metal deposition step and metal masking/etching steps, in a CMOS process according to the invention.
Figure 14:
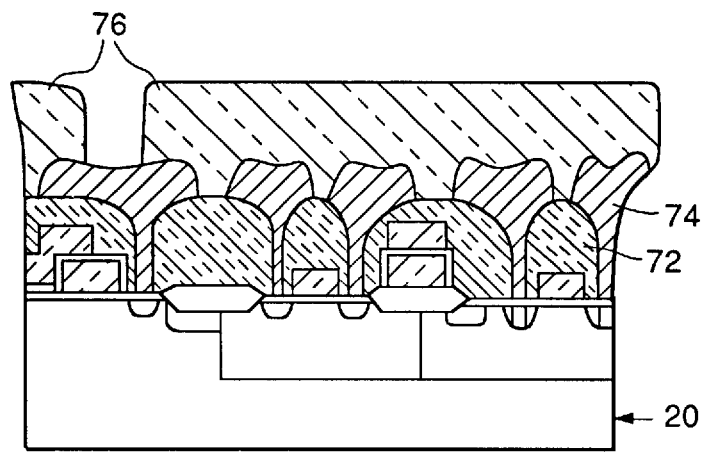
FIG. 14 is a cross-sectional view of a CMOS device illustrating fabrication principles, including still another deposition step and via opening masking/etching steps, in a CMOS process of the present invention.
Figure 15:
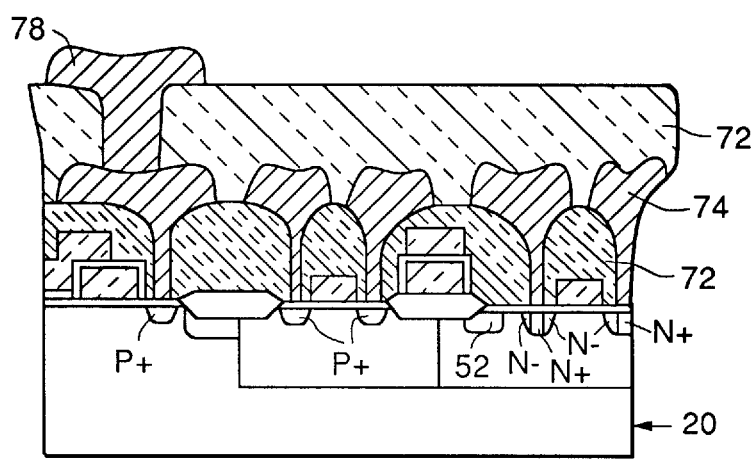
FIG. 15 is a cross-sectional view of a CMOS device illustrating fabrication principles, including another metal deposition step and further metal masking/etching steps, in a CMOS process of the present invention.

A self-aligned p+ mask and p+ implantation is applied for the implantation of p+ into the n-well 24, as shown in FIG. 11, to form p+ regions 70. As shown in FIG. 12, the photoresist 66 is stripped, and a dielectric layer 72 is deposited by chemical vapor oxide deposition. A layer of photoresist 73 is applied with a subsequent contact masking/ etching step taking place to form contacts for the device. With reference to FIG. 13, a deposition for a first metal layer 74 with a subsequent mask and etch is then carried out. FIGS. 14 and 15 respectively illustrate an interlayer dielectric oxide layer 76 formed by deposition, a via opening masking/oxide etching, and a deposition for a second metal layer 78 with subsequent masking and etching.

With the process of the present invention, fabricators can combine the channel-stop process required for low-temperature operation in radiation environments with a high-density local oxidation process. The channel length for the second polysilicon layer can be similar to that resulting from conventional CMOS processes. The CCD devices and the regular CMOS devices can be produced together with the additional masking steps outlined above without any degradation in device performance.

Those skilled in the art will further appreciate that the present invention may be embodied in other specific forms without departing from the spirit or central attributes thereof. In that the foregoing description of the present invention discloses only an exemplary embodiment, it is to be understood that other variations are contemplated as being within the scope of the present invention. Accordingly, the present invention is not limited to the particular embodiments which have been described in detail herein. Rather, reference should be made to the appended claims as indicative of the scope and content of the present invention.

What is claimed is:

1. A method for fabricating radiation-hard CMOS devices for use at cryogenic temperatures, said process comprising the steps of:

forming an n-well in a substrate, said substrate being n type;

forming a p-well in said substrate, said n-well and said p-well defining an active-area region for CMOS devices;

growing a field oxide layer in said active-area region for said CMOS devices;

growing a first gate oxide layer in said active-area region;

depositing a first polysilicon layer on said field oxide layer in said active-area region;

forming a p+ channel stop in said p-well;

forming a polyoxide layer on said first polysilicon layer;

etching said first gate oxide layer to completely remove said first gate oxide layer in said active-area region;

forming a final gate oxide layer in said active-area region;

depositing a second polysilicon layer on said polyoxide layer and on said final gate oxide layer; and forming n+/n− source/drain regions in said p-well at a distance from said p+ channel stop of about 1 $\mu$m.

2. The method of claim 1 further comprising the steps of:

etching said second polysilicon layer to define polysilicon gates for said CMOS devices.

3. The method of claim 2 wherein said etching step comprises an anisotropic plasma etch.

4. A method for fabricating radiation-hard CMOS devices for use at cryogenic temperatures, said process comprising the steps of:

forming an n-well in a substrate, said substrate being n type;

forming a p-well in said substrate, said n-well and said p-well defining an active-area region for CMOS devices, a charge-coupled device (CCD) region being defined outside of said active-area region;

growing a field oxide layer in said active-area region for said CMOS devices and in said CCD region for a CCD;

growing a first gate oxide layer in said active-area region and said CCD region;

depositing a first polysilicon layer on said field oxide layer in said active-area region and in said CCD region;

forming a p+ channel stop in said p-well;

forming a polyoxide layer on said first polysilicon layer;

etching said first gate oxide layer to completely remove said first gate oxide layer in said active-area region;

forming a final gate oxide layer in said active-area region;

depositing a second polysilicon layer on said polyoxide layer and on said final gate oxide layer; and forming n+/n− source/drain regions in said p-well at a distance from said p+ channel stop of about 1 $\mu$m.

5. The method of claim 4 further comprising the steps of:

etching said second polysilicon layer in said active-area region to define polysilicon gates for said CMOS devices.

6. The method of claim 5 wherein said etching step comprises an anisotropic plasma etch.

7. The method of claim 5 further comprising the step of:

etching said second polysilicon layer in said CCD region to define polysilicon gates in said CCD region;

etching said second polysilicon layer in said active-area region on said polyoxide layer to define a gate capacitor.

8. The method of claim 7 wherein said etching steps comprise an isotropic plasma etch.

9. The method of claim 7 wherein said etching steps comprise the step of:

over-etching to remove polysilicon sleeves of said polysilicon layers.

* * * * *